US012401366B2

(12) United States Patent
Sato et al.

(10) Patent No.: US 12,401,366 B2
(45) Date of Patent: Aug. 26, 2025

(54) SENSOR INTERFACE CIRCUIT AND SENSOR MODULE

(71) Applicants: NISSHINBO MICRO DEVICES INC., Tokyo (JP); TOKYO INSTITUTE OF TECHNOLOGY, Tokyo (JP); ALPS ALPINE CO., LTD., Tokyo (JP)

(72) Inventors: Hiroki Sato, Tokyo (JP); Masayuki Sato, Tokyo (JP); Takaaki Shirakawa, Tokyo (JP); Chunhui Pan, Tokyo (JP); Noboru Ishihara, Tokyo (JP); Shinji Murata, Tokyo (JP)

(73) Assignees: NISSHINBO MICRO DEVICES INC., Tokyo (JP); TOKYO INSTITUTE OF TECHNOLOGY, Tokyo (JP); ALPS ALPINE CO., LTD., Tokyo (JP)

( * ) Notice: Subject to any disclaimer, the term of this patent is extended or adjusted under 35 U.S.C. 154(b) by 127 days.

(21) Appl. No.: 18/286,656

(22) PCT Filed: May 26, 2021

(86) PCT No.: PCT/JP2021/020031
§ 371 (c)(1),
(2) Date: Oct. 12, 2023

(87) PCT Pub. No.: WO2022/249346
PCT Pub. Date: Dec. 1, 2022

(65) Prior Publication Data
US 2024/0195422 A1 Jun. 13, 2024

(51) Int. Cl.
*H03L 7/093* (2006.01)
*G01R 27/02* (2006.01)
*H03K 17/687* (2006.01)

(52) U.S. Cl.
CPC .......... *H03L 7/093* (2013.01); *H03K 17/6871* (2013.01); *G01R 27/02* (2013.01)

(58) Field of Classification Search
CPC ....... H03L 7/093; H03K 17/6871; G01R 27/02
See application file for complete search history.

(56) References Cited

U.S. PATENT DOCUMENTS

2010/0283513 A1* 11/2010 Horng .................... H03D 3/001
327/105
2011/0009083 A1* 1/2011 Namba ................ H03L 7/1976
455/318

(Continued)

OTHER PUBLICATIONS

Miyauchi, Kaede et al. "Low-Power Wireless Sensor Module for RF Backscattering". IEICE General Conference 2018, Japan, Mar. 20-23, 2018, B-18-17, p. 361.

(Continued)

*Primary Examiner* — Lee E Rodak
*Assistant Examiner* — Zannatul Ferdous
(74) *Attorney, Agent, or Firm* — Oliff PLC

(57) ABSTRACT

A sensor interface circuit includes a frequency synchronization circuit connectable to a sensor. The frequency synchronization circuit includes: a reference voltage source generating a reference voltage; a current source connected to the reference voltage source, and generating a current by using the reference voltage; a voltage difference detection circuit including first and second input nodes and an output node, generating a control voltage according to a difference between voltages received at the first and second input nodes, one of the voltages received at the first and second input nodes corresponding to a detection value of the sensor; a voltage-controlled oscillation circuit connected to the output node, and generating an oscillation signal according to the control voltage; and a frequency/impedance conversion circuit connected between the voltage-controlled oscil- (Continued)

lation circuit and the second input node, and converting a frequency of a signal according to the oscillation signal into impedance.

9 Claims, 8 Drawing Sheets

(56) References Cited

U.S. PATENT DOCUMENTS

2016/0099682 A1* 4/2016 Liu .................. H03B 5/364
 331/116 FE
2020/0099383 A1* 3/2020 Kubo ................ H03L 7/10

OTHER PUBLICATIONS

Jul. 6, 2021 International Search Report issued in International Patent Application No. PCT/JP2021/020031.

* cited by examiner

SENSOR INTERFACE CIRCUIT AND SENSOR MODULE

CROSS-REFERENCE TO RELATED APPLICATIONS

This application is national stage application of International Application No. PCT/JP2021/020031, filed on May 26, 2021, which designates the United States, the entire contents of which are incorporated herein by reference.

TECHNICAL FIELD

Embodiments described herein relate generally to a sensor interface circuit and a sensor module.

A sensor interface circuit having an oscillation circuit oscillates the oscillation circuit according to a level of a signal of a sensor, and generates and outputs an oscillation signal having a frequency according to the signal of the sensor. At this time, the sensor interface circuit is required to convert the signal of the sensor into frequency with high accuracy (e.g., Non-patent Literature 1: Kaede Miyauchi, Taichi Taguchi, Yosuke Ishikawa, Hiroyuki Ito, Shiro Dosho, Kazuya Masu, and Noboru Ishihara, "Evaluation Result of Test Production of Low-Power Wireless Sensor Terminal Module for RF Backscattering", 2018 IEICE General Conference, Japan, Mar. 20-23, 2018, B-18-17, p. 361).

For example, in an interface circuit, when an original oscillator such as crystal is used to convert a signal of a sensor into frequency with high accuracy, a current according to an oscillation signal of the original oscillator may continue to flow to increase current consumption; hence, it is desired to reduce current consumption.

The present invention has been made in view of the above, and an object of the present invention is to provide a sensor interface circuit and a sensor module capable of reducing current consumption.

SUMMARY

To solve the problem described above and achieve the object, a sensor interface circuit according to one aspect of the present invention includes a frequency synchronization circuit connectable to a sensor. The frequency synchronization circuit includes: a reference voltage source configured to generate a reference voltage; a current source connected to the reference voltage source, the current source being configured to generate a current by using the reference voltage; a voltage difference detection circuit including a first input node connected to the reference voltage source, a second input node connected to the current source, and an output node, one of a voltage received at the first input node and a voltage received at the second input node corresponding to a detection value of the sensor, and the voltage difference detection circuit being configured to generate a control voltage according to a difference between the voltage received at the first input node and the voltage received at the second input node; a voltage-controlled oscillation circuit connected to the output node of the voltage difference detection circuit, the voltage-controlled oscillation circuit being configured to generate an oscillation signal according to the control voltage; and a frequency/impedance conversion circuit connected between the voltage-controlled oscillation circuit and the second input node of the voltage difference detection circuit, the frequency/impedance conversion circuit being configured to convert a frequency of a signal according to the oscillation signal into impedance.

DETAILED DESCRIPTION

Figure 1:
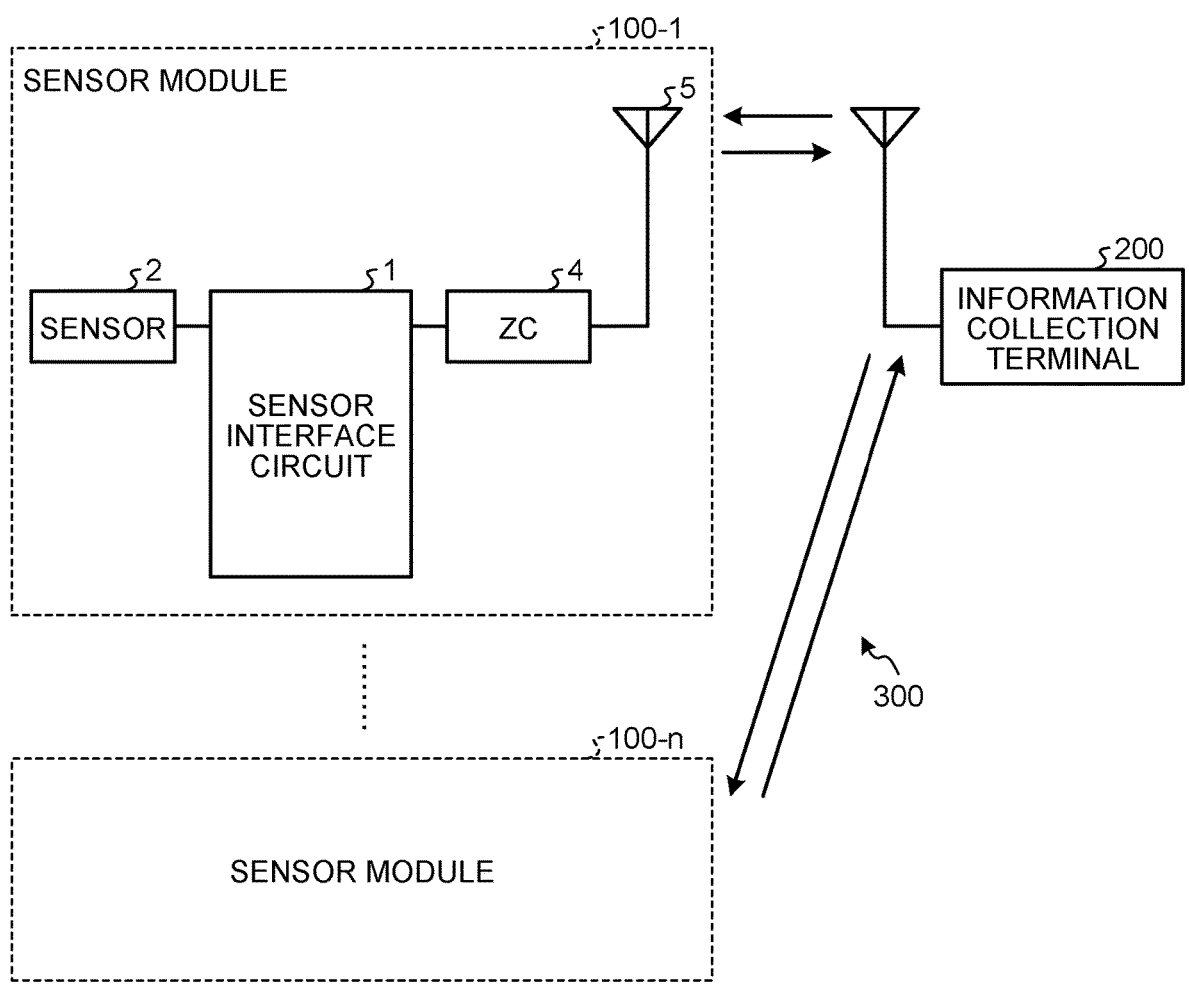
FIG. 1 is a diagram illustrating a configuration of a communication system to which a sensor module including a sensor interface circuit according to a first embodiment is applied.

Hereinafter, embodiments of a sensor interface circuit are described in detail with reference to the drawings. In the following embodiments, portions denoted by the same reference numeral perform similar operations, and a repeated description is omitted as appropriate.

First Embodiment

A sensor interface circuit according to a first embodiment is a circuit that converts a signal of a sensor into frequency. In the case where this circuit is used for Internet of Things (IoT) technology, it is conceivable to configure the circuit such that a signal according to a frequency converted by the sensor interface circuit can be communicated by RF backscatter communication.

For example, a sensor module 100 including a sensor interface circuit 1 is configured as illustrated in FIG. 1. FIG. 1 is a diagram illustrating a configuration of a communication system 300 including a sensor module 100 to which a sensor interface circuit 1 is applied.

In the communication system 300, a plurality of sensor modules 100-1 to 100-n and an information collection terminal 200 are configured to be capable of RF backscatter communication. n is an integer of 1 or more. The information collection terminal 200 can transmit an RF signal to each sensor module 100. Each sensor module 100 can, by using the RF signal, transmit a signal according to a detection value of a sensor to the information collection terminal 200.

Each sensor module 100 includes a sensor 2, the sensor interface circuit 1, an impedance conversion circuit 4, and an antenna 5. The sensor interface circuit 1 is electrically connected between the sensor 2 and the antenna 5. The sensor interface circuit 1 includes an oscillation circuit and an RF switch, and performs RF backscatter communication by, with a signal from the sensor 2, changing the frequency of the oscillation circuit and using the oscillation signal to control the on/off of the RF switch. That is, the sensor interface circuit 1 changes the impedance on the RF switch side as viewed from the antenna 5 and causes an RF signal from the information collection terminal 200 to be reflected and absorbed according to sensor information, and transmits the resulting signal to the information collection terminal 200. Thereby, in the sensor interface circuit 1, a signal of sensor information can be transmitted to the information collection terminal 200 while current consumption is reduced.

The oscillation frequency of the oscillation circuit is defined by, for example, any one of or a combination of an amplification circuit, a resistance, a capacitance, an inductor, and a delay element. When the oscillation circuit is a relaxation oscillation circuit configured with an inverter, a resistance R, and a capacitance C, the oscillation period T is theoretically expressed by Mathematical Formula 1 below.

$$T = 2 \cdot \ln 3 \cdot (R \cdot C) + Td \quad (1)$$

In Mathematical Formula 1, Td is the delay time of the inverter. To obtain high stability performance with respect to temperature with this relaxation oscillation circuit, it is desired to bring the temperature coefficients of the resistance R, the capacitance C, and the delay time Td close to zero. Since the delay time Td is the delay time of the inverter, it is difficult to obtain high stability performance with respect to temperature because the delay time Td greatly changes with power supply voltage fluctuation or temperature fluctuation.

As a specific example in which temperature stability is a problem, there is an application that detects the amount of change in frequency. By connecting the sensor to the relaxation oscillation circuit, for example, a change in oscillation frequency can be obtained according to a change in the resistance of the sensor. There is a correlation between the amount of change in the resistance of the sensor and the amount of change in oscillation frequency. For example, when the signal of the sensor changes by 1%, the frequency changes by 1%. When the relaxation oscillation circuit is oscillated at 100 kHz, the frequency change is 1 kHz; to detect the change of 1 kHz with, for example, 64 gradations, it is desired that oscillation frequency be generated with an accuracy corresponding to the amount of change of 1 kHz/64=15.625 Hz.

In order to increase the accuracy of the oscillation frequency of the oscillation circuit, it is conceivable to create an oscillation circuit by using a frequency synchronization circuit. For example, the frequency synchronization circuit is a frequency negative feedback circuit configured with an original oscillator, a frequency comparison circuit, a frequency division circuit, and a voltage-controlled oscillation circuit (VCO). The frequency difference between the oscillation frequency of the voltage-controlled oscillation circuit and a reference oscillation frequency of the original oscillator is detected, and the voltage of the voltage-controlled oscillation circuit is controlled such that the frequency difference approaches zero. As a result, the voltage-controlled oscillation circuit oscillates with the frequency accuracy of the reference oscillation frequency, and the characteristics requirements of the voltage-controlled oscillation circuit can be alleviated.

Here, in the frequency synchronization circuit, a crystal oscillator, a resonator, or the like can be used as the original oscillator for generating a reference frequency. However, using an original oscillator such as a crystal oscillator or a resonator in the sensor interface circuit 1 is difficult for the following reasons.

For example, when used for IoT, the sensor interface circuit 1 is required to reduce power consumption; however, when an original oscillator such as a crystal oscillator or a resonator is used, a current according to an oscillation signal of the original oscillator continues to be passed. Consequently, the current consumption of the sensor interface circuit 1 is increased, and it may be difficult to satisfy the requirement for power consumption reduction.

Each sensor module 100 may generate power by using an RF signal received from the information collection terminal 200, but the time from power generation to operation is limited due to the restriction of the Radio Law. In the frequency synchronization circuit, when an original oscillator such as a crystal oscillator or a resonator is used, the lock time until the frequency of the reference frequency signal is stabilized is long, and hence it may be difficult to satisfy the restriction of the Radio Law.

An original oscillator such as a crystal oscillator or a resonator tends to be physically larger than a circuit element such as a transistor. Therefore, when an original oscillator such as crystal is used in the frequency synchronization circuit, the sensor interface circuit 1 tends to increase in size, and it may be difficult to satisfy the requirement of the implementation size required for the IoT technology, for example.

An original oscillator such as a crystal oscillator or a resonator is higher in cost than a circuit element such as a transistor. Therefore, when an original oscillator such as a crystal oscillator or a resonator is used in the frequency synchronization circuit, the cost of the sensor interface circuit 1 tends to increase.

Thus, in the first embodiment, in the sensor interface circuit 1, the frequency synchronization circuit is configured to perform an operation of feedback of a frequency synchronization loop in the voltage domain instead of the frequency domain, and thereby it is attempted to increase the accuracy of the frequency synchronization circuit without using an original oscillator.

Specifically, in the sensor interface circuit 1, the frequency synchronization circuit generates a reference voltage instead of a reference frequency signal. The reference voltage can be generated by a circuit element such as a resistive element. The frequency synchronization circuit converts the oscillation frequency of an oscillation signal generated by an oscillation operation into impedance. For example, the oscillation frequency of an oscillation signal can be converted into impedance by using a switched capacitor circuit. The converted impedance is further converted into voltage by using a current according to a detection value of the sensor. The converted voltage is a voltage according to the detection value of the sensor. The operation of feedback of a frequency synchronization loop is performed such that the difference between the voltage according to the detection value of the sensor and the reference voltage approaches zero. Thereby, a frequency synchronization function can be achieved in the voltage domain, and an oscillation frequency less affected by the accuracy of the reference voltage and having high accuracy and high robustness can be obtained. As a result, the accuracy of the frequency synchronization circuit can be increased without using an original oscillator. Therefore, for example, the current consumption of the sensor interface circuit 1 can be reduced, and the requirement of power consumption reduction can be satisfied. The lock time of the frequency synchronization loop can be shortened, and the restriction of the Radio Law can be satisfied. Since a size increase of the sensor interface circuit 1 can be suppressed and the requirement of the implementation size required for the IoT technology can be satisfied, also integration into an integrated circuit is possible without degrading the accuracy of oscillation frequency. Further, the cost of the sensor interface circuit 1 can be made lower than when an original oscillator is used.

Figure 2:
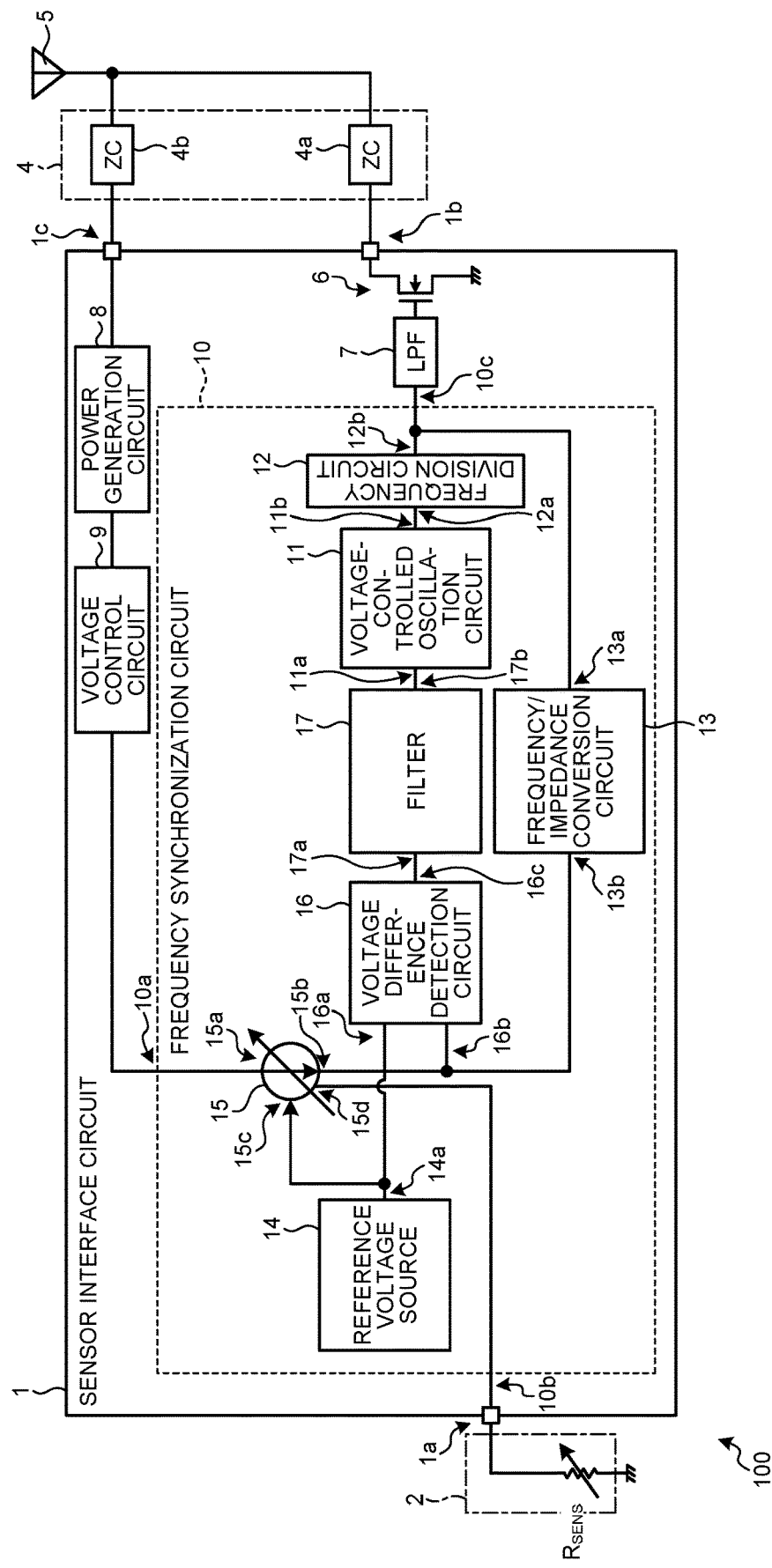
FIG. 2 is a diagram illustrating a configuration of the sensor module including the sensor interface circuit according to the first embodiment.

More specifically, a sensor interface circuit 1 including a frequency synchronization circuit 10 can be configured as illustrated in FIG. 2. FIG. 2 is a diagram illustrating a configuration of the sensor module 100 including the sensor interface circuit 1.

In the sensor module 100, the sensor interface circuit 1 is connected between the sensor 2, and the impedance conversion circuit 4 and the antenna 5. The impedance conversion circuit 4 is electrically connected between the sensor interface circuit 1 and the antenna 5.

The sensor 2 is a resistive sensor, and includes a variable resistive element $R_{SENS}$ of which the resistance value changes equivalently according to a detection value of the sensor. One end of the variable resistive element $R_{SENS}$ is connected to a terminal 1a of the sensor interface circuit 1, and the other end is connected to the ground potential.

The impedance conversion circuit 4 includes an impedance converter 4a and an impedance converter 4b. The impedance converter 4a and the impedance converter 4b are connected in parallel between the sensor interface circuit 1 and the antenna 5. One end of the impedance converter 4a is connected to the antenna 5, and the other end is connected to a terminal 1b of the sensor interface circuit 1. One end of the impedance converter 4b is connected to the antenna 5, and the other end is connected to a terminal 1c of the sensor interface circuit 1.

The sensor interface circuit 1 includes a frequency synchronization circuit 10, a low-pass filter (LPF) 7, an RF switch 6, a power generation circuit 8, and a voltage control circuit 9.

The power generation circuit 8 is electrically connected between the terminal 1c and the voltage control circuit 9. The power generation circuit 8 includes an accumulation element such as a capacitive element, and an RF signal is transmitted from the antenna 5 to the power generation circuit 8 via the impedance converter 4b and the terminal 1c.

The voltage control circuit 9 is electrically connected between the power generation circuit 8 and the frequency synchronization circuit 10. The voltage control circuit 9, in a charge period, cuts off power supply to the frequency synchronization circuit 10 to allow charge to be accumulated in the accumulation element, and in a discharge period, uses the charge accumulated in the accumulation element to supply power to the frequency synchronization circuit 10. Thereby, a power supply potential $V_{DD}$ can be supplied to an input node 10a of the frequency synchronization circuit 10.

In the frequency synchronization circuit 10, the input node 10a is electrically connected to the voltage control circuit 9, an input node 10b is electrically connected to the sensor 2 via the terminal 1a, and an output node 10c is electrically connected to the LPF 7. The frequency synchronization circuit 10 performs an oscillation operation according to a detection value of the sensor 2 (for example, a resistance value of the variable resistive element $R_{SENS}$). At this time, the frequency synchronization circuit 10 performs an operation of feedback of a frequency synchronization loop in the voltage domain.

The frequency synchronization circuit 10 generates a reference voltage $V_{REF}$. In addition, the frequency synchronization circuit 10 converts the oscillation frequency $F_{OUT}$ of an oscillation signal generated by the oscillation operation into impedance. The frequency synchronization circuit 10 further converts the converted impedance into a voltage $V_{SENS}$ by using a current $I_{SENS}$ according to the resistance value of the variable resistive element $R_{SENS}$. The converted voltage $V_{SENS}$ is a voltage according to the detection value of the sensor. The frequency synchronization circuit 10 performs the operation of feedback of a frequency synchronization loop such that the difference between the voltage $V_{SENS}$ according to the detection value of the sensor and the reference voltage $V_{REF}$ approaches 0. Thereby, a frequency synchronization function can be achieved with high accuracy in the voltage domain.

For example, as illustrated in FIG. 2, the frequency synchronization circuit 10 includes a voltage-controlled oscillation circuit 11, a frequency division circuit 12, a frequency/impedance conversion circuit 13, a reference voltage source 14, a current source 15, a voltage difference detection circuit 16, and a filter 17. The voltage difference detection circuit 16, the filter 17, the voltage-controlled oscillation circuit 11, the frequency division circuit 12, and the frequency/impedance conversion circuit 13 are connected in a loop form. This loop-formed connection forms a frequency synchronization loop. In the frequency synchronization circuit 10, the sensor 2 is connected to the current source 15, and the current $I_{SENS}$ passed by the current source 15 changes according to the detection value of the sensor 2. The frequency synchronization circuit 10 can be referred to as a current change-type frequency synchronization circuit.

Figure 3:
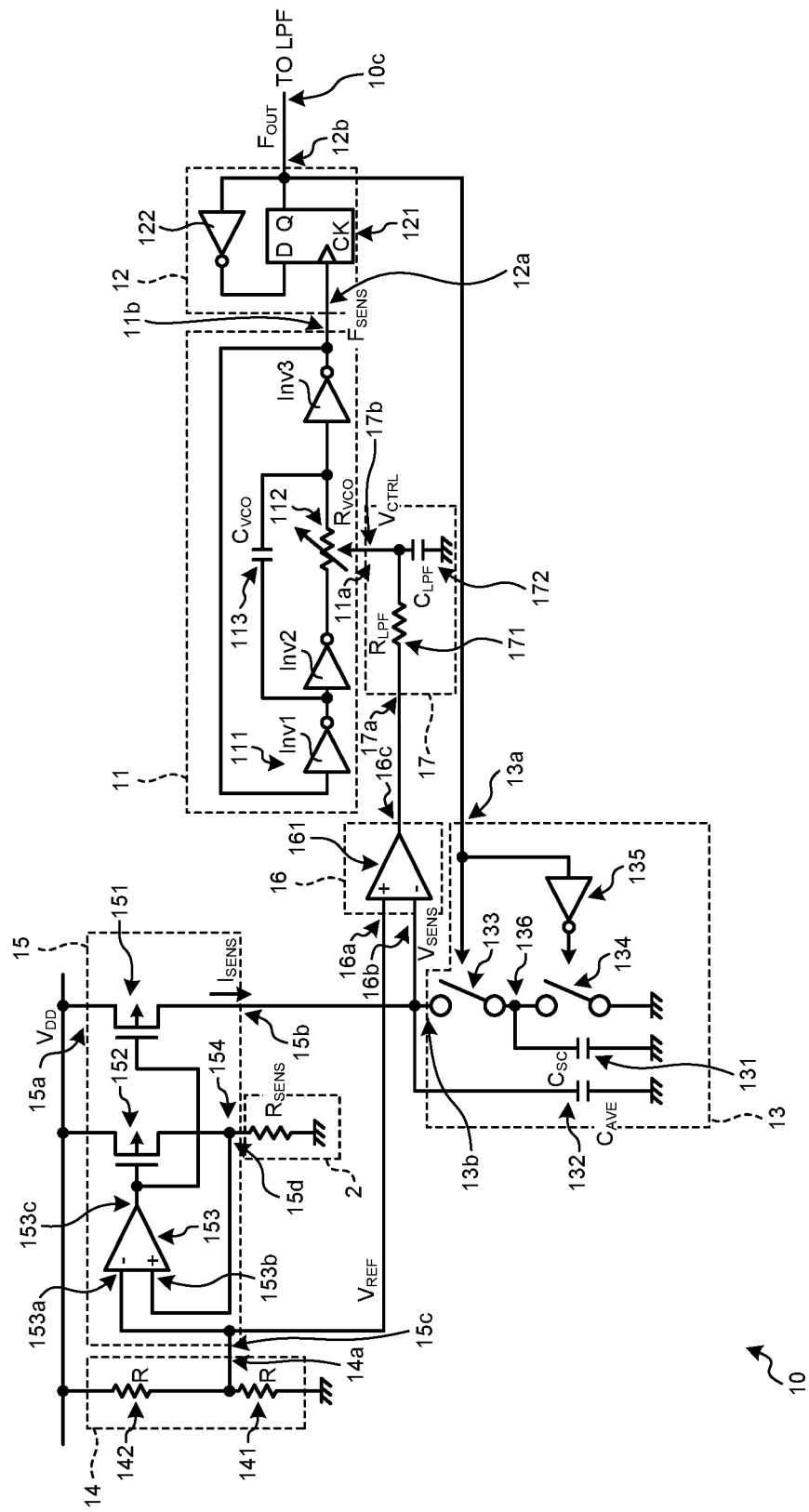
FIG. 3 is a diagram illustrating a configuration of a frequency synchronization circuit in the first embodiment.

The reference voltage source 14 is connected in parallel to the current source 15 and the voltage difference detection circuit 16. In the reference voltage source 14, an output node 14a is connected to a control node 15c of the current source 15 and an input node 16a of the voltage difference detection circuit 16. The reference voltage source 14 generates a reference voltage. For example, the reference voltage source 14 generates a reference voltage $V_{REF}$ by resistive voltage division as illustrated in FIG. 3. FIG. 3 is a diagram illustrating a configuration of the frequency synchronization circuit 10. The reference voltage source 14 includes a plurality of resistive elements 141 and 142. One end of the resistive element 141 is connected to the ground potential, and the other end is connected to the resistive element 142. One end of the resistive element 142 is connected to the resistive element 141, and the other end is connected to a power supply potential $V_{DD}$. Assuming that the resistance value of the resistive element 141 is R and the resistance value of the resistive element 142 is R, the reference voltage source 14 can generate a reference voltage $V_{RE}$ shown in Mathematical Formula 2 below.

$$V_{REF} = \{R/(R+R)\} \times V_{DD} = V_{DD}/2 \qquad (2)$$

Although FIG. 3 illustrates, as an example, a configuration in which the resistive voltage division ratio is ½, the reference voltage source 14 may be configured with another resistive voltage division ratio value larger than 0 and smaller than 1 according to a required value of the reference voltage $V_{REF}$.

The reference voltage source 14 illustrated in FIG. 2 supplies the reference voltage $V_{REF}$ to the current source 15 and the voltage difference detection circuit 16.

The current source 15 is electrically connected to the reference voltage source 14, the voltage difference detection circuit 16, and the frequency/impedance conversion circuit 13, and can be electrically connected to the sensor 2. In the current source 15, an input node 15a is connected to the voltage control circuit 9, an input node 15c is connected to the reference voltage source 14, an input node 15d is connected to the sensor 2, and an output node 15b is connected to an input node 16b of the voltage difference detection circuit 16. The current source 15 generates a current $I_{SENS}$ according to the detection value of the sensor 2, and passes the current $I_{SENS}$ to the input node 16b of the voltage difference detection circuit 16.

For example, the current source 15 can be configured as illustrated in FIG. 3. The current source 15 includes a transistor 151, a transistor 152, and a differential amplification circuit 153. The transistor 151 is electrically connected between the power supply potential $V_{DD}$ and the input node 16b of the voltage difference detection circuit 16. The transistor 151 is, for example, a PMOS transistor; the source of the transistor 151 is connected to the power supply potential $V_{DD}$, the drain is connected to the input node 16b of the voltage difference detection circuit 16, and the gate is connected to an output node 153c of the differential amplification circuit 153. The transistor 152 can be electrically connected between the power supply potential $V_{DD}$ and the sensor 2. The transistor 152 is, for example, a PMOS transistor; the source of the transistor 152 is connected to the power supply potential $V_{DD}$, the drain is connected to one end of the variable resistive element $R_{SENS}$ in the sensor 2, and the gate is connected to the output node 153c of the differential amplification circuit 153 and the gate of the transistor 151. The differential amplification circuit 153 includes an input node 153a, an input node 153b, and the output node 153c. The input node 153a is electrically connected to the reference voltage source 14, and receives the reference voltage $V_{REF}$ from the reference voltage source 14. The input node 153b is electrically connected to a node 154 between the transistor 152 and the sensor 2. The output node 153c is connected in common to the gate of the transistor 151 and the gate of the transistor 152.

That is, the transistor 151 and the transistor 152 constitute a current mirror circuit via the differential amplification circuit 153. Using a feedback loop of the differential amplification circuit 153→the transistor 152→the node 154→the differential amplification circuit 153, the differential amplification circuit 153 controls the gate voltage of the transistor 151 and the gate voltage of the transistor 152 such that the potential of the node 154 becomes equal to the reference voltage $V_{REF}$. Thus, the current $I_{SENS}'$ flowing through the variable resistive element $R_{SENS}$ is expressed by Mathematical Formula 3 below.

$$I_{SENS}' = V_{REF}/R_{SENS} \quad (3)$$

Assuming that the mirror ratio of the current mirror circuit is 1, the current $I_{SENS}$ flowing from the current source 15 to the input node 16b of the voltage difference detection circuit 16 is expressed by Mathematical Formula 4 below.

$$I_{SENS} = I_{SENS}' = V_{REF}/R_{SENS} \quad (4)$$

As shown in Mathematical Formula 4, the current $I_{SENS}$ of the current source 15 changes according to the change in the resistance value $R_{SENS}$ of the sensor 2. The current $I_{SENS}$ indicates a change in the resistance value $R_{SENS}$ of the sensor 2.

The voltage-controlled oscillation circuit 11 illustrated in FIG. 2 is electrically connected between the voltage difference detection circuit 16 and the output node 10c, and is electrically connected between the filter 17 and the frequency division circuit 12. In the voltage-controlled oscillation circuit 11, an input node 11a is electrically connected to an output node 16c of the voltage difference detection circuit 16 via the filter 17, and an output node 11b is electrically connected to the output node 10c via the frequency division circuit 12. The voltage-controlled oscillation circuit 11 performs an oscillation operation according to a control voltage $V_{CTRL}$ received from the voltage difference detection circuit 16 via the filter 17, and generates an oscillation signal having a frequency $F_{SENS}$ according to the control voltage $V_{CTRL}$.

For example, as illustrated in FIG. 3, the voltage-controlled oscillation circuit 11 can be configured with a relaxation oscillation circuit. The voltage-controlled oscillation circuit 11 includes an inverter chain 111, a variable resistive element 112, and a capacitive element 113. The inverter chain 111 includes a plurality of stages of inverters Inv1 to Inv3 connected in a ring form. Each inverter Inv is configured by, for example, connecting an NMOS transistor and a PMOS transistor in an inverter connection manner. The number of stages of inverters Inv is an odd number, for example, three. An output node of the first-stage inverter Inv1 is electrically connected to an input node of the next-stage inverter Inv2. An output node of the last-stage inverter Inv3 is electrically connected to the output node 11b of the voltage-controlled oscillation circuit 11 and an input node of the first-stage inverter Inv1. The variable resistive element 112 is electrically connected in series to the plurality of stages of inverters Inv1 to Inv3 in the inverter chain 111. FIG. 3 illustrates, as an example, a configuration in which the variable resistive element 112 is electrically connected between the output node of the inverter Inv2 and the input node of the inverter Inv3. The capacitive element 113 is connected in parallel to an inverter Inv and the variable resistive element 112 in the inverter chain 111. FIG. 3 illustrates, as an example, a configuration in which the capacitive element 113 is connected in parallel to a series connection of the second-stage inverter Inv2 and the variable resistive element 112.

In the voltage-controlled oscillation circuit 11, the variable resistive element 112 receives the control voltage $V_{CTRL}$ at a control node. The resistance value $R_{VCO}$ of the variable resistive element 112 changes according to the control voltage $V_{CTRL}$. Assuming that the capacitance value of the capacitive element 113 is $C_{VCO}$, the time constant $R_{VCO} \times C_{VCO}$ of the variable resistive element 112 and the capacitive element 113 changes with the change in the resistance value $R_{VCO}$ of the variable resistive element 112. The oscillation frequency $F_{SENS}$ of the voltage-controlled oscillation circuit 11 is determined according to the time constant $R_{VCO} \times C_{VCO}$. That is, in the voltage-controlled oscillation circuit 11, the time constant $R_{VCO} \times C_{VCO}$ changes according to the control voltage $V_{CTRL}$, and an oscillation signal having a frequency $F_{SENS}$ according to the time constant $R_{VCO} \times C_{VCO}$ after change is generated. The variable resistive element 112 may be configured with, for example, an NMOS transistor in which the drain is connected to the output node of the inverter Inv2, the source is connected to the input node of the inverter Inv3, and the control voltage $V_{CTRL}$ is applied the gate.

The voltage-controlled oscillation circuit 11 illustrated in FIG. 2 supplies an oscillation signal having the frequency $F_{SENS}$ to the frequency division circuit 12.

The frequency division circuit 12 is electrically connected between the voltage-controlled oscillation circuit 11 and the output node 10c. In the frequency division circuit 12, an input node 12a is electrically connected to the output node 11b of the voltage-controlled oscillation circuit 11, and an output node 12b is electrically connected to the output node 10c. The frequency division circuit 12 performs frequency division on an oscillation signal received at the input node 12a and generates an oscillation signal having a frequency $F_{OUT}$, and supplies the oscillation signal to the LPF 7 and the frequency/impedance conversion circuit 13. The frequency $F_{OUT}$ may be ½ of the frequency $F_{SENS}$. At this time, the frequency division circuit 12 can adjust the duty ratio of the oscillation signal to, for example, around 50%.

For example, as illustrated in FIG. 3, the frequency division circuit 12 is configured to perform frequency division by two. The frequency division circuit 12 includes a flip-flop 121 and an inverter 122. In the flip-flop 121, a data input node D is connected to an output node of the inverter 122, a clock node CK is connected to the output node 11b of the voltage-controlled oscillation circuit 11, and a data output node Q is connected to an input node of the inverter 122, the LPF 7, and the frequency/impedance conversion circuit 13. The flip-flop 121 holds a signal in which an output signal of its own is logically inverted in synchronization with the rising edge of the waveform of the oscillation signal, and toggles output signals of its own. Thereby, the frequency division circuit 12 performs frequency division by two on the oscillation signal received at the input node 12a, and generate an oscillation signal having a frequency $F_{OUT}$ ($=F_{SENS}/2$). Further, the frequency division circuit 12 can adjust the duty ratio of the oscillation signal to around 50% by toggling oscillation signals outputted with the period of the received oscillation signal.

The frequency division circuit 12 illustrated in FIG. 2 outputs an oscillation signal having the frequency $F_{OUT}$ to the LPF 7, and feeds back the oscillation signal to the frequency/impedance conversion circuit 13.

The frequency/impedance conversion circuit 13 is electrically connected between the voltage-controlled oscillation circuit 11 and the input node 16b of the voltage difference detection circuit 16, and is electrically connected between the frequency division circuit 12 and the input node 16b of the voltage difference detection circuit 16. The frequency/impedance conversion circuit 13 is provided on a feedback line from the output node 12b of the frequency division circuit 12 to the input node 16b of the voltage difference detection circuit 16. In the frequency/impedance conversion circuit 13, an input node 13a is connected to the frequency division circuit 12, and an output node 13b is connected to the input node 16b of the voltage difference detection circuit 16. The frequency/impedance conversion circuit 13 receives an oscillation signal from the frequency division circuit 12, and converts the frequency $F_{OUT}$ of the oscillation signal into impedance.

For example, as illustrated in FIG. 3, the frequency/impedance conversion circuit 13 can be configured with a switched capacitor circuit. The switched capacitor circuit is a circuit that limits current or voltage like a resistor by combining a switch and a capacitive element. The frequency/impedance conversion circuit 13 can set the circuit impedance to a value according to the frequency of the oscillation signal by charging and discharging the capacitive element according to the oscillation signal.

The frequency/impedance conversion circuit 13 includes a capacitive element 131, a capacitive element 132, a switch 133, a switch 134, and an inverter 135. One end of the capacitive element 131 is connected to the ground potential, and the other end is connected to a node 136 between the switch 133 and the switch 134. One end of the capacitive element 132 is connected to the ground potential, and the other end is connected to the input node 16b of the voltage difference detection circuit 16. One end of the switch 133 is connected to the input node 16b of the voltage difference detection circuit 16, the other end is connected to the node 136, and a control end is connected to the voltage-controlled oscillation circuit 11 via the frequency division circuit 12. One end of the switch 134 is connected to the node 136, the other end is connected to the ground potential, and a control end is connected to the inverter 135. In the inverter 135, an input node is connected to the voltage-controlled oscillation circuit 11 via the frequency division circuit 12, and an output node is connected to the switch 134.

In the frequency/impedance conversion circuit 13, the switch 133 and the switch 134 are complementarily turned on and off according to the level of the oscillation signal. Thereby, the capacitive element 131 is charged and discharged. When the oscillation signal is at an H level, the switch 133 is maintained in the off state and the switch 134 is maintained in the on state, the charge of the capacitive element 131 is discharged to the ground potential, and the capacitive element 131 is discharged. When the oscillation signal is at an L level, the switch 133 is maintained in the on state and the switch 134 is maintained in the off state, a charge according to the current $I_{SENS}$ is accumulated in the capacitive element 131, and the capacitive element 131 is charged. At this time, the capacitive element 132 maintains a state where a charge according to the current $I_{SENS}$ is accumulated regardless of the level of the oscillation signal.

That is, the frequency/impedance conversion circuit 13 can generate an impedance equivalently corresponding to the frequency $F_{OUT}$ by periodically repeating charge and discharge on the capacitive element 131 by means of an oscillation signal having the frequency $F_{OUT}$. The output voltage of the frequency/impedance conversion circuit 13 appears as the voltage $V_{SENS}$ of the input node 16b of the voltage difference detection circuit 16. The voltage $V_{SENS}$ changes in a time constant manner during charge of the capacitive element 131, but converges to a stable point while being averaged by the capacitive element 132 that maintains accumulation of a charge according to the current $I_{SENS}$.

Figure 4:
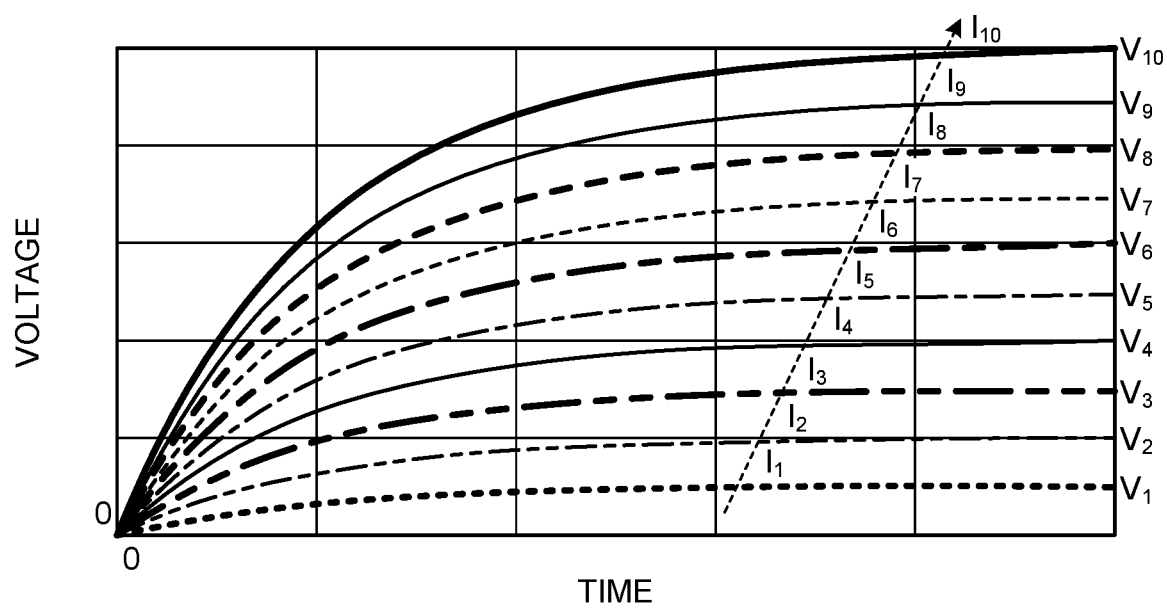
FIG. 4 is a diagram illustrating an operation of a frequency/impedance conversion circuit in the first embodiment.

For example, as illustrated in FIG. 4, when the current $I_{SENS}=I_1$, then $V_{SENS}=V_1$, which is a voltage at the time of convergence to a stable point. When the current $I_{SENS}=I_2$, then $V_{SENS}=V_2$, which is a voltage at the time of convergence to a stable point. When the current $I_{SENS}=I_0$, then $V_{SENS}=V_{10}$, which is a voltage at the time of convergence to a stable point. FIG. 4 is a diagram illustrating an operation of the frequency/impedance conversion circuit 13, where the vertical axis represents the magnitude of voltage and the horizontal axis represents time. In the frequency/impedance conversion circuit 13, it can be seen that when the flowing-in current $I_{SENS}$ increases, the voltage $V_{SENS}$ at the time of convergence to a stable point rises almost in proportion thereto. That is, assuming that the capacitance value of the capacitive element 132 is $C_{AVE}$ and the capacitance value of the capacitive element 131 is $C_{SC}$, the voltage $V_{SENS}$ of the input node 16b of the voltage difference detection circuit 16 at the time of convergence to a stable point is expressed by Mathematical Formula 5 below.

$$V_{SENS}=I_{SENS}/(F_{OUT} \cdot C_{SC}) \tag{5}$$

As shown in Mathematical Formula 5, in a state of convergence to a stable point, the frequency $F_{OUT}$ of the oscillation signal is converted into an impedance $1/(F_{OUT} \cdot C_{SC})$ by the frequency/impedance conversion circuit 13. Equivalently, one end of the impedance $1/(F_{OUT} \cdot C_{SC})$ is connected to the input node 16b of the voltage difference detection circuit 16, and the other end is connected to the ground potential. Therefore, at the input node 16b of the voltage difference detection circuit 16, the current $I_{SENS}$ from the current source 15 flows into the equivalent impedance $1/(F_{OUT} \cdot C_{SC})$, and thereby the current $I_{SENS}$ is converted into the voltage $V_{SENS}$ by the equivalent impedance $1/(F_{OUT} \cdot C_{SC})$. The Voltage $V_{SENS}$ Includes the Current $I_{SENS}$, and corresponds to the detection value of the sensor 2. Further, the voltage $V_{SENS}$ includes the frequency $F_{CUT}$, and corresponds to the oscillation frequency $F_{SENS}$ of the voltage-controlled oscillation circuit 11.

The reference voltage source 14, the current source 15, and the frequency/impedance conversion circuit 13 are connected to input terminals of the voltage difference detection circuit 16 illustrated in FIG. 2, and the filter 17 is electrically connected to an output terminal of the voltage difference detection circuit 16. In the voltage difference detection circuit 16, the input node 16a is connected to the reference voltage source 14, the input node 16b is connected to the current source 15 and the frequency/impedance conversion circuit 13, and the output node 16c is connected to the filter 17. The voltage difference detection circuit 16 receives the reference voltage $V_{REF}$ at the input node 16a, and a voltage $V_{SENS}$ is generated at the input node 16b by the current source 15 and the frequency/impedance conversion circuit 13. According to the difference between the reference voltage $V_{REF}$ and the voltage $V_{SENS}$, the voltage difference detection circuit 16 generates a control voltage $V_{CTRL}'$ for making control such that the difference becomes smaller.

For example, as illustrated in FIG. 3, the voltage difference detection circuit 16 includes a differential amplification circuit 161. In the differential amplification circuit 161, a non-inverting input terminal (+) is connected to the reference voltage source 14, an inverting input terminal (−) is connected to the current source 15 and the frequency/impedance conversion circuit 13, and an output terminal is connected to the filter 17. The differential amplification circuit 161 amplifies the difference between the reference voltage $V_{REF}$ and the voltage $V_{SENS}$ to generate a control voltage $V_{CTRL}'$.

The filter 17 illustrated in FIG. 2 is electrically connected between the voltage difference detection circuit 16 and the voltage-controlled oscillation circuit 11. In the filter 17, an input node 17a is connected to the voltage difference detection circuit 16, and an output node 17b is connected to the voltage-controlled oscillation circuit 11. The filter 17 receives the control voltage $V_{CTRL}'$ from the voltage difference detection circuit 16, and performs filtering processing on the control voltage $V_{CTRL}'$. The filter 17 supplies the control voltage $V_{CTRL}$ after filtering processing to the voltage-controlled oscillation circuit 11.

For example, as illustrated in FIG. 3, the filter 17 can be configured with a low-pass filter. The filter 17 includes a resistive element 171 and a capacitive element 172. One end of the resistive element 171 is connected to on output terminal of the differential amplification circuit 161, and the other end is connected to one end of the capacitive element 172 and the voltage-controlled oscillation circuit 11. The other end of the capacitive element 172 is connected to the ground potential. With this configuration, the filter 17 can subject the control voltage $V_{CTRL}'$ to Low-Pass Filtering Processing for smoothing, and supply the smoothed control voltage $V_{CTRL}$ to the voltage-controlled oscillation circuit 11.

In the frequency synchronization circuit 10, using a frequency synchronization loop of the voltage difference detection circuit 16→the filter 17→the voltage-controlled oscillation circuit 11→the frequency division circuit 12→the frequency/impedance conversion circuit 13→the voltage difference detection circuit 16, the voltage difference detection circuit 16 performs feedback control on the control voltage $V_{CTRL}$ such that the voltage $V_{SENS}$ becomes equal to the reference voltage $V_{REF}$. That is, when the feedback control works normally, Mathematical Formula 6 below holds.

$$V_{REF} = V_{SENS} \tag{6}$$

When Mathematical Formula 6 is substituted into Mathematical Formula 5, Mathematical Formula 7 below is obtained.

$$V_{REF} = I_{SENS}/(F_{OUT} \cdot C_{SC}) \tag{7}$$

When Mathematical Formula 7 is solved for the frequency $F_{OUT}$, Mathematical Formula 8 below is obtained.

$$F_{OUT} = 1/\{(V_{REF}/I_{SENS}) \cdot C_{SC}\} \tag{8}$$

When Mathematical Formula 4 is substituted into Mathematical Formula 8, Mathematical Formula 9 below is obtained.

$$F_{OUT} = 1/\{R_{SENS} \cdot C_{SC}\} \tag{9}$$

As shown in Mathematical Formula 9, it can be seen that, in the frequency synchronization circuit 10, an oscillation frequency $F_{OUT}$ according to an equivalent resistance value $R_{SENS}$ of the sensor 2 is obtained without depending on the reference voltage $V_{REF}$. Thereby, a frequency synchronization function can be achieved in the voltage domain, and an oscillation frequency $F_{OUT}$ less affected by the accuracy of the reference voltage $V_{REF}$ can be obtained. That is, an oscillation frequency $F_{OUT}$ with high accuracy and high robustness can be obtained.

Further, as shown in Mathematical Formula 9, in the frequency synchronization circuit 10, an oscillation frequency $F_{OUT}$ insensitive to the power supply potential $V_{DD}$ can be obtained. Thereby, resistance to fluctuation of the power supply potential $V_{DD}$ can be enhanced, and characteristics requirements on the voltage control circuit 9 can be alleviated. As a result, when the sensor interface circuit 1 is implemented with a semiconductor chip, the chip cost can be reduced.

Further, as shown in Mathematical Formula 9, in the frequency synchronization circuit 10, an oscillation frequency $F_{OUT}$ insensitive to the variation in characteristics of the transistor can be obtained. Thereby, characteristics requirements on the transistor can be alleviated. As a result, when the sensor interface circuit 1 is implemented with a semiconductor chip, the chip cost can be reduced.

Further, as shown in Mathematical Formula 9, in the frequency synchronization circuit 10, an oscillation frequency $F_{OUT}$ insensitive to temperature can be obtained by obtaining an oscillation frequency $F_{OUT}$ depending on a resistance value and a capacitance value with small temperature characteristics. Thereby, resistance to temperature fluctuation can be improved with inexpensive components without using a crystal oscillator or a MEMS resonator. As a result, when the sensor interface circuit 1 is implemented with a semiconductor chip, the chip cost can be reduced.

Figure 5:
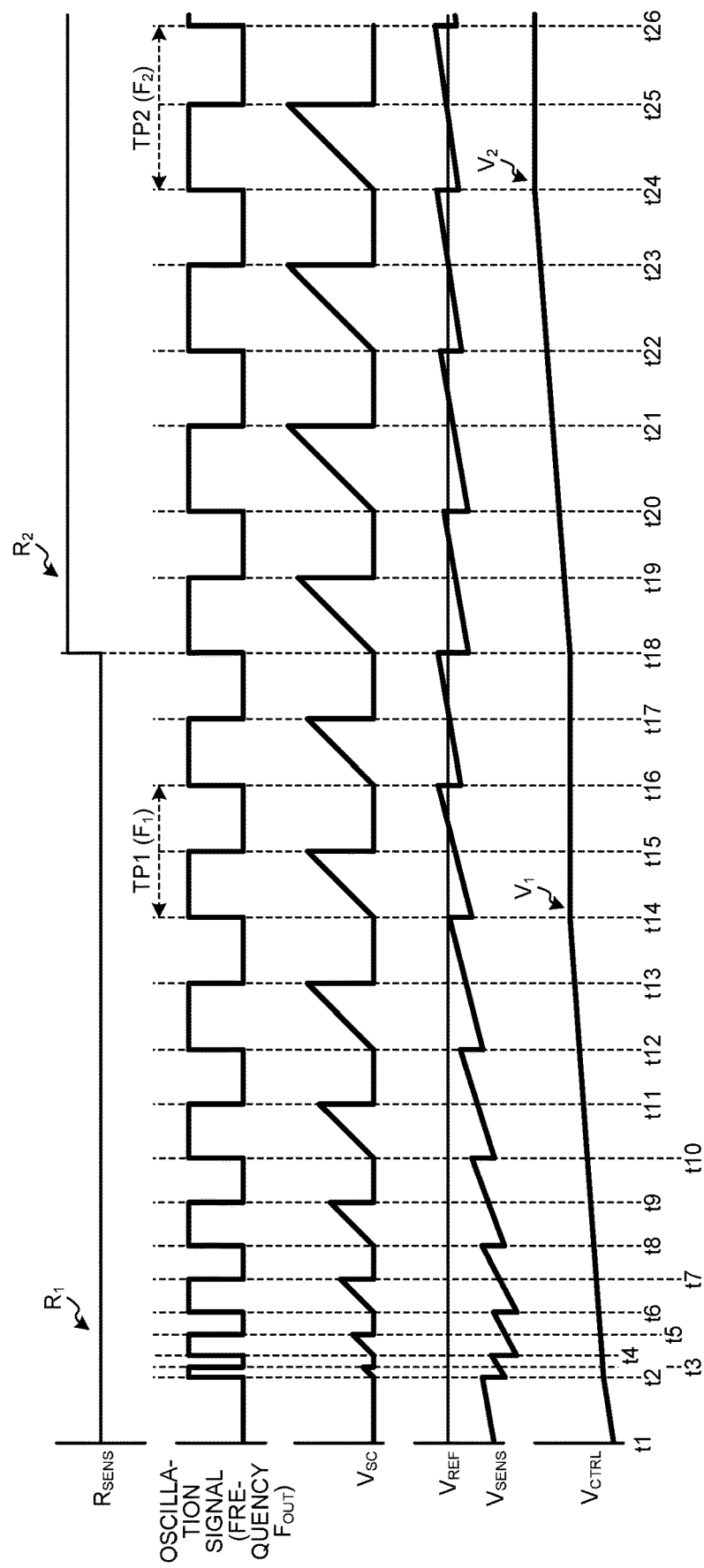
FIG. 5 is a waveform diagram illustrating an operation of the frequency synchronization circuit in the first embodiment.

Next, an operation of the frequency synchronization circuit 10 is described using FIG. 5. FIG. 5 is a waveform diagram illustrating an operation of the frequency synchronization circuit 10.

At timing t1, when the frequency synchronization circuit 10 is activated, the current source 15 starts to pass a current $I_{SENS} = I_1$ according to a resistance value $R_{SENS} = R_1$ of the sensor 2. In accordance with this, in the frequency/impedance conversion circuit 13, a charge according to the current $I_{SENS} = I_1$ is accumulated in the capacitive element 132, and the voltage $V_{SENS}$ rises gradually. At this time, the oscillation signal is at the L level, the switch 133 is maintained in the off state, the switch 134 is maintained in the on state, the capacitive element 131 is in the discharge state, and the voltage $V_{SC}$ thereof is substantially equal to the ground potential. Further, since the reference voltage $V_{REF}$ is maintained fixed, the voltage difference detection circuit 16 gradually increases the control voltage $V_{CTRL}$ as the voltage $V_{SENS}$ rises gradually.

At timing t2, the voltage-controlled oscillation circuit 11 starts an oscillation operation, and the level of the oscillation signal becomes the H level. In accordance with this, the switch 133 is turned on, and the switch 134 is turned off. The voltage $V_{SENS}$ is lowered momentarily due to the fact that one end of the capacitive element 131 is connected to the input node 16b. After that, charge is redistributed between the capacitive elements 131 and 132, and a charge according to the current $I_{SENS}=I_1$ is injected into each of the capacitive elements 131 and 132; accordingly, the voltage $V_{SC}$ and the voltage $V_{SENS}$ rise gradually.

At timing t3, the level of the oscillation signal becomes the L level. In accordance with this, the switch 133 is turned off, and the switch 134 is turned on. The capacitive element 131 is discharged, and its voltage $V_{SC}$ is lowered to the ground potential. At this time, since the capacitive element 132 holds charge, the voltage $V_{SENS}$ continues to rise gradually in accordance with a charge according to the current $I_{SENS}=I_1$ being injected into the capacitive element 132.

At timing t4, the level of the oscillation signal becomes the H level. In accordance with this, the switch 133 is turned on, and the switch 134 is turned off. The voltage $V_{SENS}$ is lowered momentarily due to the fact that one end of the capacitive element 131 is connected to the input node 16b. After that, charge is redistributed between the capacitive elements 131 and 132, and a charge according to the current $I_{SENS}=I_1$ is injected into each of the capacitive elements 131 and 132; accordingly, the voltage $V_{SC}$ and the voltage $V_{SENS}$ rise gradually.

At timing t5, the level of the oscillation signal becomes the L level. In accordance with this, the switch 133 is turned off, and the switch 134 is turned on. The capacitive element 131 is discharged, and its voltage $V_{SC}$ is lowered to the ground potential. At this time, since the capacitive element 132 holds charge, the voltage $V_{SENS}$ continues to rise gradually in accordance with a charge according to the current $I_{SENS}=I_1$ being injected into the capacitive element 132.

At timings t6 to t14, similar operations to those at timings t4 and t5 and similar operations to those at timings t5 and t6 are alternately repeated; and the voltage $V_{SENS}$ approaches the reference voltage $V_{REF}$ on a time average basis while fluctuating in a sawtooth-like waveform, and the control voltage $V_{CTRL}$ gradually approaches the value $V_1$. Accordingly, the frequency $F_{OUT}$ of the oscillation signal approaches a value $F_1$ corresponding to the resistance value $R_{SENS}=R_1$ of the sensor 2.

When at timing t14 the voltage $V_{SENS}$ becomes equal to the reference voltage $V_{REF}$ on a time average basis, then from timing t14 to timing t18, the control voltage $V_{CTRL}$ is stabilized at the value $V_1$, the frequency $F_{OUT}$ of the oscillation signal is stabilized at a value $F_1$ corresponding to the resistance value $R_{SENS}=R_1$ of the sensor 2, and the frequency synchronization loop is set in a locked state. Thereby, the frequency synchronization circuit 10 stably outputs a frequency $F_{OUT}=F_1$ corresponding to the resistance value $R_{SENS}=R_1$ of the sensor 2. The period TP1 is a period corresponding to the frequency $F_1$.

At timing t18, the resistance value $R_{SENS}$ of the sensor 2 changes to $R_2$ ($>R_1$) due to a state change or the like of the detection target of the sensor 2, and the current changes to the current $I_{SENS}=I_2$ ($<I_1$). In accordance with this, at timings t18 to t24, similar operations to those at timings t4 and t5 and similar operations to those at timings t5 and t6 are alternately repeated; and the voltage $V_{SENS}$ approaches the reference voltage $V_{REF}$ on a time average basis while fluctuating in a sawtooth-like waveform, and the control voltage $V_{CTRL}$ gradually approaches the value $V_2$ ($>V_1$). Accordingly, the frequency $F_{OUT}$ of the oscillation signal approaches a value $F_2$ ($<F_1$) corresponding to the resistance value $R_{SENS}=R_2$ of the sensor 2.

When at timing t24 the voltage $V_{SENS}$ becomes substantially equal to the reference voltage $V_{REF}$ on a time average basis, then on or after timing t24, the control voltage $V_{CTRL}$ is stabilized at the value $V_2$, the frequency $F_{OUT}$ of the oscillation signal is stabilized at a value $F_2$ corresponding to the resistance value $R_{SENS}=R_2$ of the sensor 2, and the frequency synchronization loop is set in a locked state again. Thereby, the frequency synchronization circuit 10 stably outputs a frequency $F_{UT}=F_2$ corresponding to the resistance value $R_{SENS}=R_2$ of the sensor 2. The period TP2 is a period corresponding to the frequency $F_2$.

As above, in the first embodiment, in the sensor interface circuit 1, the frequency synchronization circuit 10 is configured to perform an operation of feedback of a frequency synchronization loop in the voltage domain instead of the frequency domain. Thereby, an oscillation frequency not depending on the accuracy of the reference voltage can be obtained, and the accuracy of the operation of feedback of a frequency synchronization loop can be easily increased in the voltage domain. Therefore, the accuracy of the frequency synchronization circuit 10 can be increased without using an original oscillator.

In the frequency synchronization circuit 10, when the duty ratio of the oscillation signal outputted from the voltage-controlled oscillation circuit 11 is close to 50%, the frequency division circuit 12 may be omitted. Further, when the control voltage outputted from the voltage difference detection circuit 16 is smooth, the filter 17 may be omitted.

Second Embodiment

Next, a sensor interface circuit 1j according to a second embodiment is described. In the following, portions different from those of the first embodiment are mainly described.

As a frequency synchronization circuit that performs an operation of feedback of a frequency synchronization loop in the voltage domain, in the first embodiment a current change-type frequency synchronization circuit is given as an example, whereas in the second embodiment a voltage change-type frequency synchronization circuit is given as an example. With respect to the change in the detection value of the sensor, the current of a current source changes in the current change-type frequency synchronization circuit, whereas the voltage amplified and outputted by an amplification circuit is changed in the voltage change-type frequency synchronization circuit.

Figure 6:
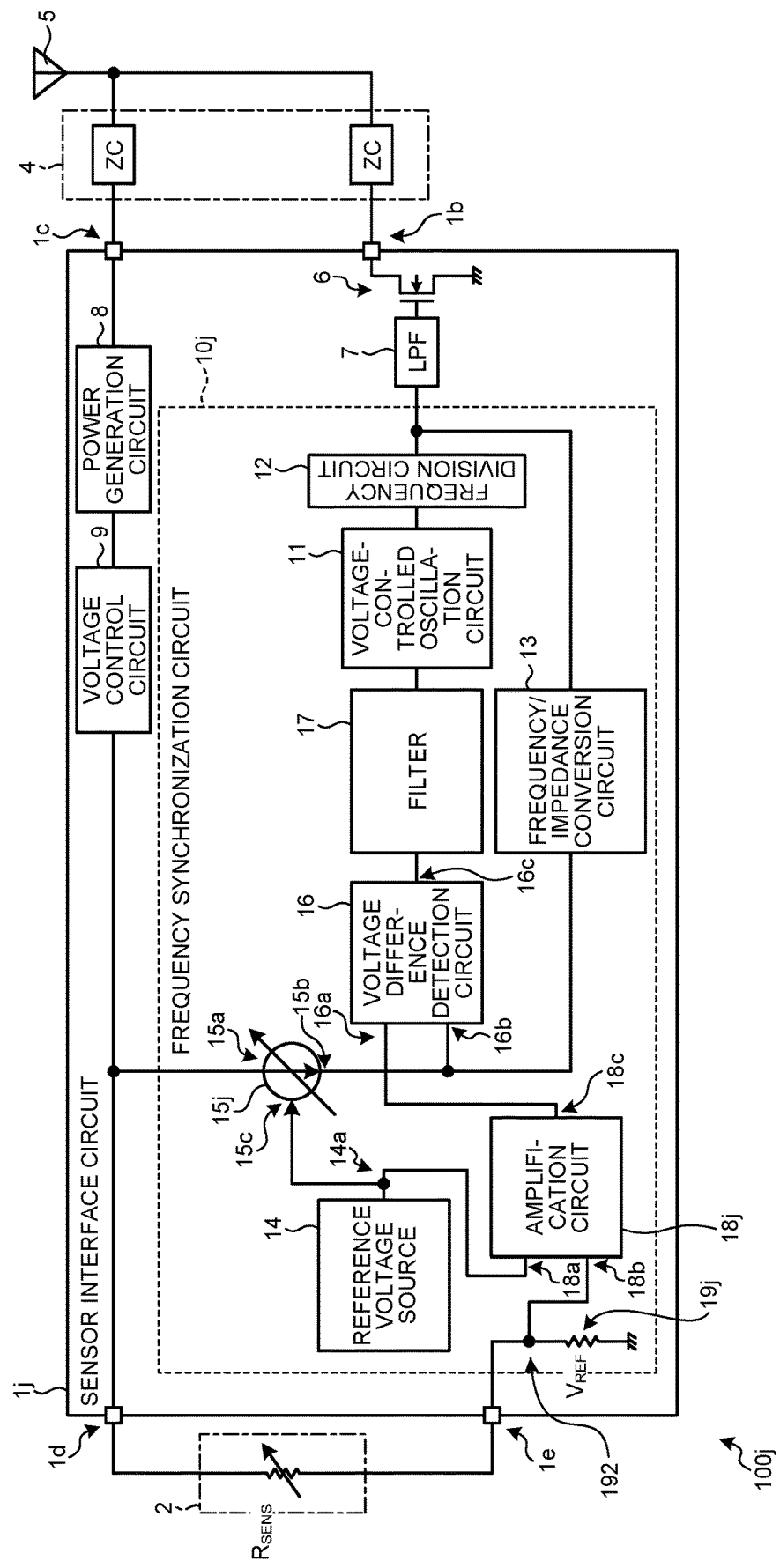
FIG. 6 is a diagram illustrating a configuration of a sensor module including a sensor interface circuit according to a second embodiment.

Specifically, a sensor module 100j including the sensor interface circuit 1j can be configured as illustrated in FIG. 6. FIG. 6 is a diagram illustrating a configuration of the sensor module 100j including the sensor interface circuit 1j according to the second embodiment.

The sensor interface circuit 1j includes a frequency synchronization circuit 10j instead of the frequency synchronization circuit 10 (see FIG. 2). The frequency synchronization circuit 10j includes a current source 15j instead of the current source 15 (see FIG. 2), and further includes an amplification circuit 18j and a resistive element 19j.

The amplification circuit 18j is electrically connected between the reference voltage source 14 and the voltage difference detection circuit 16, and can be electrically connected to the sensor 2. In the amplification circuit 18j, an input node 18a is connected to the reference voltage source 14, an input node 18b is connected to a node 192 between the resistive element 19j and the variable resistive element $R_{SENS}$, and an output node 18c is connected to the voltage difference detection circuit 16.

The reference voltage source 14 is connected to the current source 15j and the amplification circuit 18j. In the reference voltage source 14, an output node 14a is connected to a control node 15c of the current source 15j and the input node 18a of the amplification circuit 18j. The reference voltage source 14 generates a reference voltage $V_{REF}'$. The amplification circuit 18j receives the reference voltage $V_{REF}'$ at the input node 18a.

One end of the variable resistive element $R_{SENS}$ of the sensor 2 is connected to the voltage control circuit 9 via a terminal 1d of the sensor interface circuit 1j, and the other end is connected to the amplification circuit 18j and the resistive element 19j via a terminal 1e of the sensor interface circuit 1j. A power supply potential $V_{DD}$ is supplied to one end of the variable resistive element $R_{SENS}$, and the other end is connected to one end of the resistive element 19j. The other end of the resistive element 19j is connected to the ground potential. The resistive element 19j is a reference resistive element, and has a resistance value serving as a reference for change in the resistance value of the variable resistive element $R_{SENS}$. Thereby, a voltage $V_{SENS}'$ obtained by the power supply potential $V_{DD}$ being subjected to resistive voltage division according to the resistance value of the variable resistive element $R_{SENS}$ is applied to the input node 18b of the amplification circuit 18j. The voltage $V_{SENS}'$ changes according to the change in the resistance value $R_{SENS}$ of the sensor 2. The voltage $V_{SENS}'$ indicates a change in the resistance value $R_{SENS}$ of the sensor 2.

The amplification circuit 18j amplifies the difference between the reference voltage $V_{REF}'$ and the voltage $V_{SENS}'$, and outputs a voltage $V_{SENS}$ according to the amplified difference. The voltage $V_{SENS}$ corresponds to a detection value of the sensor 2 (for example, a resistance value of the variable resistive element $R_{SENS}$) That is, the voltage difference detection circuit 16 is different from that of the first embodiment in that the voltage $V_{SENS}$ corresponding to the detection value of the sensor 2 is received at the input node 16a instead of the input node 16b (see FIG. 3) and the reference voltage $V_{REF}$ is received at the input node 16b instead of the input node 16a (see FIG. 3).

Figure 7:
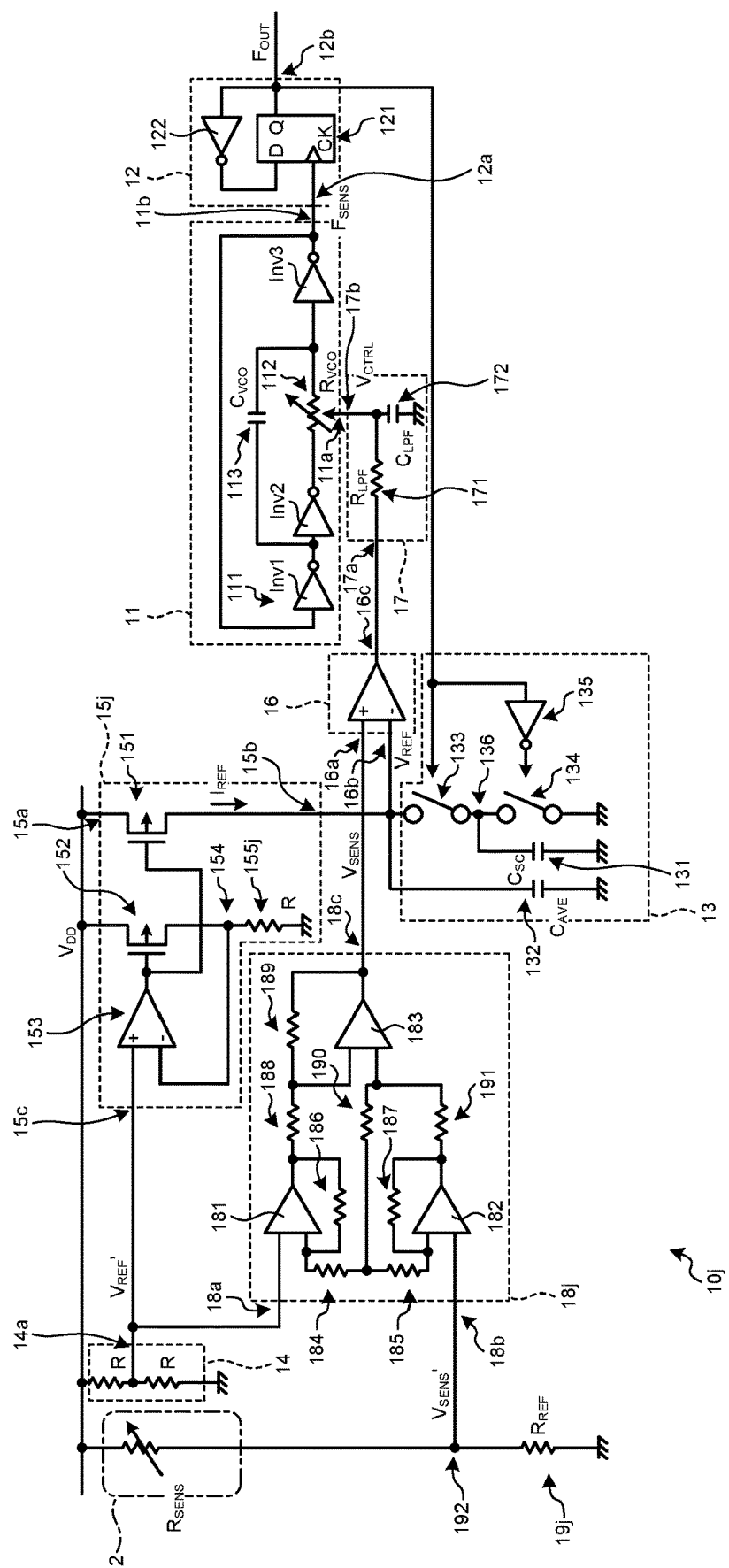
FIG. 7 is a diagram illustrating a configuration of a frequency synchronization circuit in the second embodiment.

For example, as illustrated in FIG. 7, the amplification circuit 18j is configured with an instrumentation amplification circuit. The amplification circuit 18j includes a plurality of drivers 181 to 183 and a plurality of resistive elements 184 to 191. In the driver 181, a first input node is connected to the reference voltage source 14, a second input node is connected to one end of the resistive element 184 and one end of the resistive element 186, and an output node is connected to one end of the resistive element 188 and the other end of the resistive element 186. In the driver 182, a first input node is connected to the node 192, a second input node is connected to one end of the resistive element 185 and one end of the resistive element 187, and an output node is connected to one end of the resistive element 191 and the other end of the resistive element 187. In the driver 183, a first input node is connected to the other end of the resistive element 188 and one end of the resistive element 189, a second input node is connected to one end of the resistive element 190 and the other end of the resistive element 191, and an output node is connected to the other end of the resistive element 189. The other end of the resistive element 190 is connected to the other end of the resistive element 184 and the other end of the resistive element 185. The driving forces of the plurality of drivers 181 to 183 may be equal to each other. The resistance values of the plurality of resistive elements 184 to 191 may be equal to each other.

With this configuration, the amplification circuit 18j can amplify the difference of the voltage $V_{SENS}'$ from the reference voltage $V_{REF}'$ to a larger value to generate a voltage $V_{SENS}$. Assuming that the resistance value of the resistive element 19j is $R_{REF}$ and the resistance value of the sensor 2 (the variable resistive element $R_{SENS}$) is $R_{SENS}$, the voltage $V_{SENS}'$ is expressed by Mathematical Formula 10 below.

$$V_{SENS}'=V_{DD}\cdot\{R_{REF}/(R_{REF}+R_{SENS})\} \quad (10)$$

Further, assuming that the amplification factor of the amplification circuit 18j is A, the voltage $V_{SENS}$ after amplification is expressed by Mathematical Formula 11 below.

$$V_{SENS}=(V_{SENS}'-V_{REF}')\cdot A+V_{REF}' \quad (11)$$

Since $V_{REF}'=V_{DD}/2$, when Mathematical Formula 10 is substituted into Mathematical Formula 11, Mathematical Formula 12 below is obtained.

$$V_{SENS}=(V_{DD}\cdot\{R_{REF}/(R_{REF}+R_{SENS})\}-V_{DD}/2)\cdot A+V_{DD}/2 \quad (12)$$

As shown in Mathematical Formulae 11 and 12, the amplification circuit 18j can amplify the difference of the voltage $V_{SENS}'$ from the reference voltage $V_{REF}'$ to a larger value to generate a voltage $V_{SENS}$.

The current source 15j illustrated in FIG. 6 is not connected to the sensor 2, and passes a reference current $I_{REF}$ according to the reference voltage $V_{REF}'$ to the input node 16b of the voltage difference detection circuit 16.

For example, as illustrated in FIG. 7, the current source 15j further includes a resistive element 155j. The resistive element 155j has a fixed resistance value. The present embodiment is similar to the first embodiment in that, using a feedback loop of the differential amplification circuit 153→the transistor 152→the node 154→the differential amplification circuit 153, the differential amplification circuit 153 controls the gate voltage of the transistor 151 and the gate voltage of the transistor 152 such that the potential of the node 154 becomes equal to the reference voltage $V_{REF}'$. Thereby, the current source 15j can pass a reference current $I_{REF}$ according to the reference voltage $V_{REF}'$ to the input node 16b of the voltage difference detection circuit 16. Since $V_{REF}'=V_{DD}/2$, assuming that the resistance value of the resistive element 155j is R, Mathematical Formula 13 below holds.

$$I_{REF}=(V_{DD}/2)/R \quad (13)$$

The output voltage of the frequency/impedance conversion circuit 13 appears as the voltage $V_{REF}$ of the input node 16b of the voltage difference detection circuit 16. The voltage $V_{REF}$ changes in a time constant manner during charge of the capacitive element 131, but converges to a stable point while being averaged by the capacitive element 132 that maintains accumulation of a charge according to the current $I_{REF}$. The voltage $V_{SENS}$ of the input node 16b of the voltage difference detection circuit 16 at the time of convergence to a stable point is expressed by Mathematical Formula 14 below.

$$V_{REF}=I_{REF}/(F_{OUT}\cdot C_{SC}) \quad (14)$$

As shown in Mathematical Formula 14, in a state of convergence to a stable point, the frequency $F_{OUT}$ of the oscillation signal is converted into an impedance "1/($F_{OUT} \cdot C_{SC}$)" by the frequency/impedance conversion circuit 13. Equivalently, one end of the impedance "1/($F_{OUT} \cdot C_{SC}$)" is connected to the input node 16b of the voltage difference detection circuit 16, and the other end is connected to the ground potential. Therefore, at the input node 16b of the voltage difference detection circuit 16, the current $I_{REF}$ from the current source 15j flows into the equivalent impedance "1/($F_{OUT} \cdot C_{SC}$)", and thereby the current $I_{REF}$ is converted into the voltage $V_{REF}$ by the equivalent impedance "1/($F_{OUT} \cdot C_{SC}$)". The present embodiment is similar to the first embodiment in that the voltage $V_{REF}$ includes the frequency $F_{OUT}$ and corresponds to the oscillation frequency $F_{SENS}$ of the voltage-controlled oscillation circuit 11, but is different from the first embodiment in that the voltage $V_{REF}$ does not correspond to the detection value of the sensor 2. Instead, the voltage $V_{SENS}$ shown in Mathematical Formula 12 includes the resistance value $R_{SENS}$, and corresponds to the detection value of the sensor 2.

The present embodiment is similar to the first embodiment in that, in the frequency synchronization circuit 10j, using a frequency synchronization loop of the voltage difference detection circuit 16→the filter 17→the voltage-controlled oscillation circuit 11→the frequency division circuit 12→the frequency/impedance conversion circuit 13→the voltage difference detection circuit 16, the voltage difference detection circuit 16 performs feedback control on the control voltage $V_{CTRL}$ such that the voltage $V_{SENS}$ becomes equal to the reference voltage $V_{REF}$. That is, when the feedback control works normally, Mathematical Formula 6 holds. When Mathematical Formula 6 is substituted into Mathematical Formula 14, Mathematical Formula 15 below is obtained.

$$V_{SENS} = I_{REF} / (F_{OUT} \cdot C_{SC}) \quad (15)$$

When Mathematical Formulae 12 and 13 are substituted into Mathematical Formula 15, Mathematical Formula 16 below is obtained.

$$(V_{DD} \cdot \{R_{REF}/(R_{REF}+R_{SENS})\} - V_{DD}/2) \cdot A + V_{DD}/2 = \{(V_{DD}/2)/R\} \cdot \{1/(F_{OUT} \cdot C_{SC})\} \quad (16)$$

When $\{R_{REF}/(R_{REF}+R_{SENS})\}$=RS is set in Mathematical Formula 16, Mathematical Formula 16 is rewritten as Mathematical Formula 17 below. RS is a parameter indicating a change in the resistance value $R_{SENS}$ of the sensor 2.

$$(V_{DD} \cdot RS - V_{DD}/2) \cdot A + V_{DD}/2 = \{(V_{DD}/2)/R\} \cdot \{1/(F_{OUT} \cdot C_{SC})\} \quad (17)$$

When Mathematical Formula 17 is solved for the frequency $F_{OUT}$, Mathematical Formula 18 below is obtained.

$$F_{OUT} = [\{(V_{DD}/2)/R\} \cdot \{1/(C_{SC})\}] / [(V_{DD} \cdot RS - V_{DD}/2) \cdot A + V_{DD}/2] = \{1/(C_{SC} \cdot R)\} \cdot [1/\{2 \cdot A \cdot RS + (1-A)\}] \quad (18)$$

As shown in Mathematical Formula 18, in the sensor interface circuit 1j, the oscillation frequency can be designed by the first term $\{1/(C_{SC} \cdot R)\}$ on the right side, and the sensitivity (amplification factor A) to the detection value of the sensor 2 can be designed by the second term $[1/\{2 \cdot A \cdot RS + (1-A)\}]$. That is, an oscillation frequency $F_{OUT}$ with higher accuracy and higher robustness can be obtained than in the first embodiment.

Figure 8:
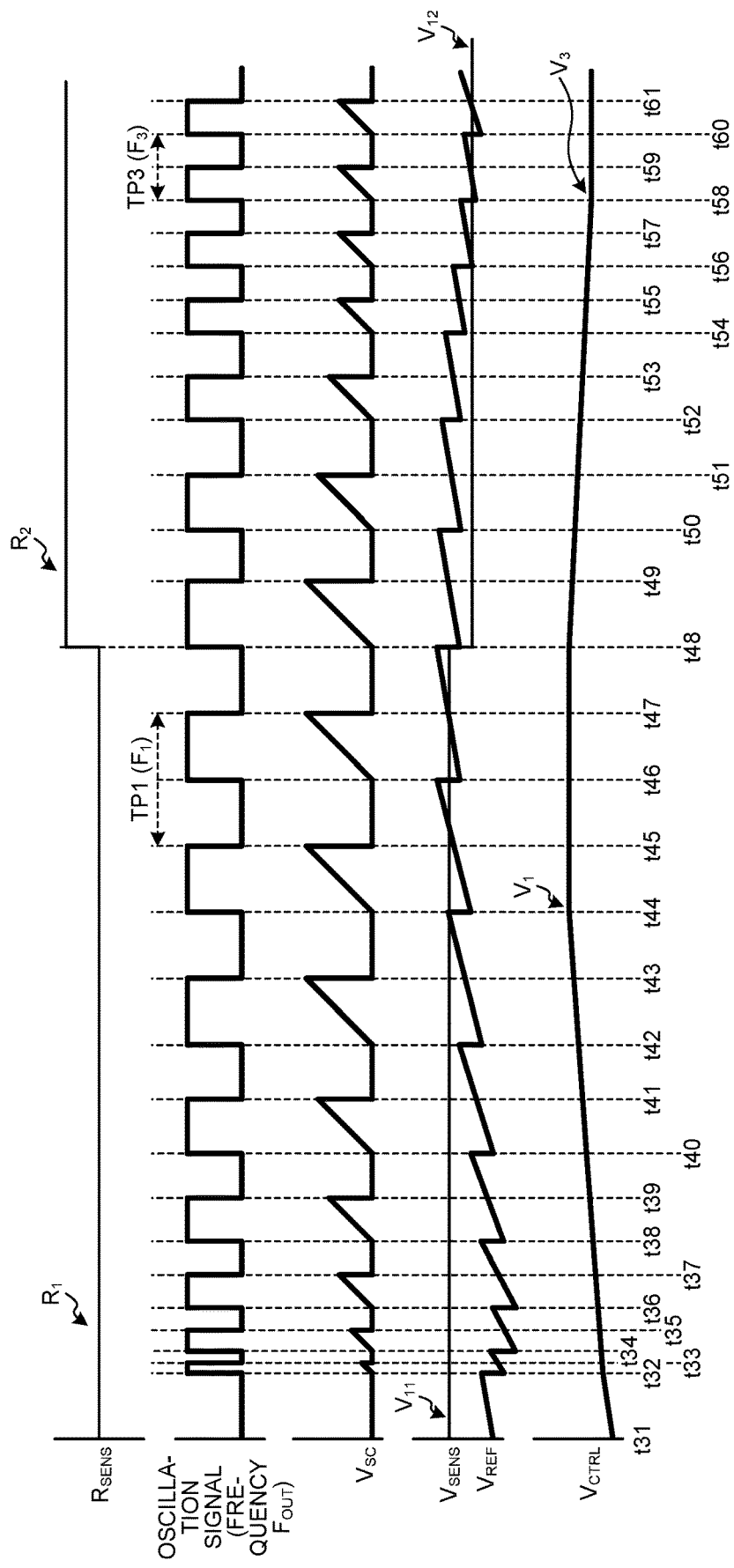
FIG. 8 is a waveform diagram illustrating an operation of the frequency synchronization circuit in the second embodiment.

Further, as illustrated in FIG. 8, the operation of the frequency synchronization circuit 10j is different from that of the first embodiment in the following point. FIG. 8 is a waveform diagram illustrating an operation of the frequency synchronization circuit 10j.

In the waveform diagram of FIG. 8, in contrast to the waveform diagram of FIG. 5, what changes in a sawtooth-like form is replaced from the voltage $V_{SENS}$ to the voltage $V_{REF}$, and what is relatively fixed is replaced from the voltage $V_{REF}$ to the voltage $V_{SENS}$. The voltage $V_{SENS}$ is almost fixed during a period when the resistance value $R_{SENS}$ of the sensor 2 is fixed, but when the resistance value $R_{SENS}$ of the sensor 2 changes, changes accordingly.

At timing t31, when the frequency synchronization circuit 10j is activated, the current source 15j starts to pass a current $I_{REF}=I_{11}$ according to the reference voltage $V_{REF}'$. In accordance with this, in the frequency/impedance conversion circuit 13, a charge according to the current $I_{REF}=I_{11}$, is accumulated in the capacitive element 132, and the voltage $V_{REF}$ rises gradually. At this time, the oscillation signal is at the L level, the switch 133 is maintained in the off state, the switch 134 is maintained in the on state, the capacitive element 131 is in the discharge state, and the voltage $V_{SC}$ thereof is substantially equal to the ground potential. Further, since the reference voltage $V_{SENS}$ is maintained almost at the value $V_{11}$, the voltage difference detection circuit 16 gradually increases the control voltage $V_{CTRL}$ as the voltage $V_{REF}$ rises gradually.

At timing t32, the voltage-controlled oscillation circuit 11 starts an oscillation operation, and the level of the oscillation signal becomes the H level. In accordance with this, the switch 133 is turned on, and the switch 134 is turned off. The voltage $V_{REF}$ is lowered momentarily due to the fact that one end of the capacitive element 131 is connected to the input node 16b. After that, charge is redistributed between the capacitive elements 131 and 132, and a charge according to the current $I_{REF}=I_{11}$ is injected into each of the capacitive elements 131 and 132; accordingly, the voltage $V_{SC}$ and the voltage $V_{REF}$ rise gradually.

At timing t33, the level of the oscillation signal becomes the L level. In accordance with this, the switch 133 is turned off, and the switch 134 is turned on. The capacitive element 131 is discharged, and its voltage $V_{SC}$ is lowered to the ground potential. At this time, since the capacitive element 132 holds charge, the voltage $V_{REF}$ continues to rise gradually in accordance with a charge according to the current $I_{REF}=I_{11}$ being injected into the capacitive element 132.

At timing t34, the level of the oscillation signal becomes the H level. In accordance with this, the switch 133 is turned on, and the switch 134 is turned off. The voltage $V_{REF}$ is lowered momentarily due to the fact that one end of the capacitive element 131 is connected to the input node 16b. After that, charge is redistributed between the capacitive elements 131 and 132, and a charge according to the current $I_{REF}=I_{11}$ is injected into each of the capacitive elements 131 and 132; accordingly, the voltage $V_{SC}$ and the voltage $V_{REF}$ rise gradually.

At timing t35, the level of the oscillation signal becomes the L level. In accordance with this, the switch 133 is turned off, and the switch 134 is turned on. The capacitive element 131 is discharged, and its voltage $V_{SC}$ is lowered to the ground potential. At this time, since the capacitive element 132 holds charge, the voltage $V_{REF}$ continues to rise gradually in accordance with a charge according to the current $I_{REF}=I_{11}$ being injected into the capacitive element 132.

At timings t36 to t44, similar operations to those at timings t34 and t35 and similar operations to those at timings t35 and t36 are alternately repeated; and the voltage $V_{REF}$ approaches the voltage $V_{SENS}=V_{11}$ on a time average basis while fluctuating in a sawtooth-like waveform, and the control voltage $V_{CTRL}$ gradually approaches the value $V_1$.

Accordingly, the frequency $F_{OUT}$ of the oscillation signal approaches a value $F_1$ corresponding to the resistance value $R_{SENS}=R_1$ of the sensor 2.

When at timing t44 the voltage $V_{REF}$ becomes substantially equal to the reference voltage $V_{SENS}$ on a time average basis, then from timing t44 to timing t48, the control voltage $V_{CTRL}$ is stabilized at the value $V_1$, the frequency $F_{OUT}$ of the oscillation signal is stabilized at a value $F_1$ corresponding to the resistance value $R_{SENS}=R_1$ of the sensor 2, and the frequency synchronization loop is set in a locked state. Thereby, the frequency synchronization circuit 10j stably outputs a frequency $F_{OUT}=F_1$ corresponding to the resistance value $R_{SENS}=R_1$ of the sensor 2. The period TP1 is a period corresponding to the frequency $F_1$.

At timing t48, the resistance value $R_{SENS}$ of the sensor 2 changes to $R_2$ ($>R_1$) due to a state change or the like of the detection target of the sensor 2, and the voltage changes to the voltage $V_{SENS}=V_{12}$ ($<V_{11}$). In accordance with this, at timings t48 to t58, similar operations to those at timings t34 and t35 and similar operations to those at timings t35 and t36 are alternately repeated; and the voltage $V_{REF}$ approaches the reference voltage $V_{SENS}$ on a time average basis while fluctuating in a sawtooth-like waveform, and the control voltage $V_{CTRL}$ gradually approaches the value $V_3$ ($<V_1$). Accordingly, the frequency $F_{OUT}$ of the oscillation signal approaches a value $F_3$ ($>F_1$) corresponding to the resistance value $R_{SENS}=R_2$ of the sensor 2.

When at timing t58 the voltage $V_{REF}$ becomes substantially equal to the voltage $V_{SENS}$ on a time average basis, then on or after timing t58, the control voltage $V_{CTRL}$ is stabilized at the value $V_3$, the frequency $F_{OUT}$ of the oscillation signal is stabilized at a value $F_3$ corresponding to the resistance value $R_{SENS}=R_2$ of the sensor 2, and the frequency synchronization loop is set in a locked state again. Thereby, the frequency synchronization circuit 10j stably outputs a frequency $F_{OUT}=F_3$ corresponding to the resistance value $R_{SENS}=R_2$ of the sensor 2. The period TP3 is a period corresponding to the frequency $F_3$.

As above, in the second embodiment, in the sensor interface circuit 1j, the frequency synchronization circuit 10j is configured with a voltage change-type frequency synchronization circuit, and changes the voltage amplified and outputted by the amplification circuit 18j with respect to the change in the detection value of the sensor 2. Also with such a configuration, an oscillation frequency not depending on the accuracy of the reference voltage $V_{REF}$' can be obtained, and the accuracy of the operation of feedback of a frequency synchronization loop can be easily increased in the voltage domain.

According to the present invention, an effect capable of reducing current consumption is exhibited.

Although several embodiments according to the present invention have been described, these embodiments are presented for illustrative purposes only and are not intended to limit the scope of the invention. These novel embodiments can be implemented in various other forms, and various omissions, substitutions, and modifications can be made within the scope and spirit of the invention. The embodiments and modifications thereto are within the scope and spirit of the invention and are within the invention described in claims and equivalents thereof.

What is claimed is:

1. A sensor interface circuit comprising:
   a frequency synchronization circuit connectable to a sensor,
   the frequency synchronization circuit including:
   a reference voltage source configured to generate a reference voltage;
   a current source connected to the reference voltage source, the current source being configured to generate a current by using the reference voltage;
   a voltage difference detection circuit including a first input node connected to the reference voltage source, a second input node connected to the current source, and an output node, one of a voltage received at the first input node and a voltage received at the second input node corresponding to a detection value of the sensor, and the voltage difference detection circuit being configured to generate a control voltage according to a difference between the voltage received at the first input node and the voltage received at the second input node;
   a voltage-controlled oscillation circuit connected to the output node of the voltage difference detection circuit, the voltage-controlled oscillation circuit being configured to generate an oscillation signal according to the control voltage; and
   a frequency/impedance conversion circuit connected between the voltage-controlled oscillation circuit and the second input node of the voltage difference detection circuit, the frequency/impedance conversion circuit being configured to convert a frequency of a signal according to the oscillation signal into impedance.

2. The sensor interface circuit according to claim 1, wherein
   the current source is connectable to the sensor and is configured to generate a current by using the reference voltage and the detection value of the sensor, and
   in the voltage difference detection circuit, the voltage received at the second input node corresponds to the detection value of the sensor and the frequency.

3. The sensor interface circuit according to claim 2, wherein
   the current source includes:
   a first transistor connected between a second potential and the second input node of the voltage difference detection circuit;
   a second transistor connectable between the second potential and the sensor; and
   a differential amplification circuit including a first input node connected to the reference voltage source, a second input node connected to a node between the second transistor and the sensor, and an output node connected in common to a gate of the first transistor and a gate of the second transistor.

4. The sensor interface circuit according to claim 1, further comprising:
   an amplification circuit connected between the reference voltage source and the voltage difference detection circuit and connectable to the sensor, the amplification circuit being configured to amplify a difference between the reference voltage and the detection value of the sensor and output a voltage according to the amplified difference, wherein
   in the voltage difference detection circuit, the voltage received at the first input node corresponds to the detection value of the sensor, and the voltage received at the second input node corresponds to the frequency.

5. The sensor interface circuit according to claim 4, wherein the current source includes:
a resistive element;
a first transistor connected between a second potential and the second input node of the voltage difference detection circuit;
a second transistor connected between the second potential and the resistive element; and
a differential amplification circuit including a first input node connected to the amplification circuit, a second input node connected to a node between the second transistor and the resistive element, and an output node connected in common to a gate of the first transistor and a gate of the second transistor.

6. The sensor interface circuit according to claim 1, further comprising:
a frequency division circuit connected between the voltage-controlled oscillation circuit and the frequency/impedance conversion circuit, the frequency division circuit being configured to perform frequency division on the oscillation signal, wherein
the frequency/impedance conversion circuit is configured to convert a frequency of the signal subjected to frequency division into impedance.

7. The sensor interface circuit according to claim 1, wherein the frequency/impedance conversion circuit is configured with a switched capacitor circuit.

8. The sensor interface circuit according to claim 7, wherein the frequency/impedance conversion circuit includes:
a first capacitive element of which one end is connected to a first potential;
a second capacitive element of which one end is connected to the first potential and another end is connected to the second input node of the voltage difference detection circuit;
a first switch of which one end is connected to the second input node of the voltage difference detection circuit, another end is connected to another end of the first capacitive element, and a control end is connected to the voltage-controlled oscillation circuit;
an inverter connected to the voltage-controlled oscillation circuit; and
a second switch of which one end is connected to the other end of the first capacitive element, another end is connected to the first potential, and a control end is connected to the inverter.

9. A sensor module comprising:
an antenna;
an impedance conversion circuit;
a sensor; and
the sensor interface circuit according to claim 1, the sensor interface circuit being connected between the sensor and the antenna.

* * * * *